(12) United States Patent
Lee et al.

(10) Patent No.: US 7,964,948 B2
(45) Date of Patent: *Jun. 21, 2011

(54) CHIP STACK, CHIP STACK PACKAGE, AND METHOD OF FORMING CHIP STACK AND CHIP STACK PACKAGE

(75) Inventors: Jong-joo Lee, Suwon-si (KR); Sun-won Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 291 days.

This patent is subject to a terminal disclaimer.

(21) Appl. No.: 11/790,359

(22) Filed: Apr. 25, 2007

(65) Prior Publication Data

US 2008/0001276 A1 Jan. 3, 2008

(30) Foreign Application Priority Data

Jun. 30, 2006 (KR) .................. 10-2006-0060664

(51) Int. Cl.
*H01L 23/02* (2006.01)

(52) U.S. Cl. . 257/686; 257/685; 257/777; 257/E25.006; 257/E25.013; 257/25.018; 257/E25.021; 257/E25.027; 438/109

(58) Field of Classification Search .......... 257/686, 257/E23.18, E23.011, E21.499
See application file for complete search history.

(56) References Cited

U.S. PATENT DOCUMENTS

| 6,091,138 | A | * | 7/2000 | Yu et al. ..................... 257/686 |
| 7,462,930 | B2 | * | 12/2008 | Lee et al. .................... 257/686 |
| 7,768,115 | B2 | * | 8/2010 | Lee et al. .................... 257/686 |
| 2001/0015773 | A1 | * | 8/2001 | Eldridge et al. ............. 348/765 |
| 2003/0096454 | A1 | | 5/2003 | Poo et al. |
| 2005/0104181 | A1 | * | 5/2005 | Lee et al. .................... 257/686 |
| 2007/0170575 | A1 | * | 7/2007 | Lee et al. .................... 257/686 |
| 2007/0278657 | A1 | * | 12/2007 | Lee ............................. 257/692 |

FOREIGN PATENT DOCUMENTS

| JP | 07050326 A | * | 2/1995 |
| KR | 10-2003-0000529 A | | 1/2003 |
| KR | 10-2003-0018642 A | | 3/2003 |
| KR | 10-2004-0091580 A | | 10/2004 |

* cited by examiner

*Primary Examiner* — Marcos D Pizarro
*Assistant Examiner* — Raj Gupta
(74) *Attorney, Agent, or Firm* — Harness, Dickey & Pierce, P.L.C.

(57) ABSTRACT

A chip stack may include a first chip and a second chip stacked on the first chip. Each of the first and second chips may include a substrate having an active surface and an inactive surface opposite to the active surface; an internal circuit in the active surface; an I/O chip pad on the active surface and connected to the internal circuit through an I/O buffer; and a I/O connection pad connected to the I/O chip pad through the I/O buffer by a circuit wiring. A redistributed I/O chip pad layer may be on the active surface of the first chip, the redistributed I/O chip pad layer redistributing the I/O chip pad. The I/O connection pads of the first chip and the second chip may be electrically connected to each other by an electrical connecting part.

66 Claims, 8 Drawing Sheets

CHIP STACK, CHIP STACK PACKAGE, AND METHOD OF FORMING CHIP STACK AND CHIP STACK PACKAGE

PRIORITY STATEMENT

This U.S. non-provisional application claims the benefit of priority of Korean Patent Application No. 10-2006-0060664, filed on Jun. 30, 2006, in the Korean Intellectual Property Office (KIPO), the disclosure of which is incorporated herein in its entirety by reference.

BACKGROUND

1. Field

Example embodiments relate to a semiconductor package, for example, to a chip stack, a chip stack package, and method of forming a chip stack and chip stack package.

2. Description of the Related Art

Semiconductor memory devices, for example, dynamic random access memory (DRAM), have been developed to increase operating speeds and capacity (product capacity). In order to achieve higher capacity, a method of stacking the chips may be used. The capacity of a semiconductor memory device using a stacked chip structure may be increased in proportion to the number of chips in the same package area.

FIG. 1 is a sectional view illustrating a conventional chip stack package.

In particular, a conventional chip stack package may be formed by stacking two chips 12 and 22 on an upper surface 32 of a wiring (interconnection) substrate 30. An adhesive layer 38 may be interposed between the chips 12 and 22. Chip pads 14 and 24 formed on the chips 12 and 22, respectively, may be electrically connected to a wiring pad 16 of the wiring substrate 30 by bonding wires 36. The chips 12 and 22 may be mounted on the upper surface 32 of the wiring substrate 30. A molding compound 40 may be formed on the resulting chip stack structure which may protect the bonding wires 36. External connection terminals 42 may be formed on a lower surface 34 of the wiring substrate 30. The external connection terminals 42 may be electrically connected to the chip pads 14 and 24 by an internal wiring (interconnection) 28.

In a conventional chip stack package, an input capacitive load of an external connection terminal 42 may be increased as compared to an input capacitive load in a single chip package, e.g., a package having one embedded chip. By way of example, in a conventional chip stack package, because two chip pads 14 and 24 in parallel may be connected to one external connection terminal 42, an input capacitive load may be doubled as compared to that of a single chip package. The input capacitive load may increase in proportion to the number of stacked chips.

However, if the input capacitive load of a conventional chip stack package is increased, the operating speed of the conventional chip stack package may be decreased. For example, in the operation of a conventional chip stack package, one chip may be operating while the other chip may be turned off to reduce heat. The chip pads 14 and 24 may both be connected to one external connection terminal 42. Thus, the input capacitive load may be increased, thereby decreasing the operating speed of the conventional chip stack package.

SUMMARY

Example embodiments provide a chip stack, and a chip stack package including the chip stack, that may be capable of increasing device capacity while maintaining operating speeds equal to or similar to that of a single chip package by decreasing an input capacitive load.

Example embodiments provide a method of forming a chip stack, and chip stack package including the chip stack, that may include the chip stack.

In an example embodiment, a chip stack may include a first chip and a second chip stacked on the first chip. Each of the first and second chips may include a substrate having an active surface and an inactive surface opposite to the active surface; an internal circuit in the active surface; an input/output (I/O) chip pad on the active surface and connected to the internal circuit through an I/O buffer; and an I/O connection pad connected to the I/O chip pad through the I/O buffer by a circuit wiring. A redistributed I/O chip pad layer may be on the active surface of the first chip, the redistributed I/O chip pad layer redistributing the I/O chip pad. The I/O connection pads of the first chip and the second chip may be electrically connected to each other by an electrical connecting part.

According to an example embodiment, the I/O chip pad may be t the center portion of the substrate, and the redistributed chip pad layer may include a redistributed chip pad which redistributes the I/O chip pad layer to one of an edge region and a scribe region of the substrate.

According to an example embodiment, a through electrode may be formed in a substrate below the redistributed I/O chip pad.

According to an example embodiment, the first chip and the second chip may be stacked such that the active surface of the first chip faces the active surface of the second chip.

According to an example embodiment, a test pad may be formed spaced apart from the I/O chip pad of the first chip, and a through electrode may be formed in the substrate below the test pad.

According to an example embodiment, the first and second chips may be stacked such that an inactive surface of the first chip faces the active surface of the second chip.

According to an example embodiment, a through electrode may be formed in the substrate below the I/O connection pad of the first chip, the through electrode being connected to the I/O connection pad of the second chip.

According to an example embodiment, each of the first and second chips may further include a ground chip pad connected to a ground wiring of the internal circuit; and a ground connection pad connected to the ground chip pad. A redistributed ground chip pad layer may be formed on the active surface of the first chip, the redistributed ground chip pad layer redistributing the ground chip pad. The ground connection pads of the first chip and the second chip may be electrically connected to each other by an electrical connecting part.

According to an example embodiment, the redistributed ground chip pad layer may be connected to the ground connection pad and the ground wiring of the internal circuit.

According to an example embodiment, the ground connection pad may be formed at the center portion of the substrate, and the redistributed ground chip pad layer may include a redistributed ground chip pad which redistributes the ground connection pad to one of an edge region and a scribe region of the substrate.

According to an example embodiment, the I/O connection pad may be formed at the center portion of the substrate, and the redistributed I/O chip pad layer may include a redistributed I/O chip pad which redistributes the ground connection pad to one of an edge region and a scribe region of the substrate.

In an example embodiment, a chip stack package may include a first chip and a second chip stacked on the first chip. Each of the first and second chips may include a substrate having an active surface and an inactive surface opposite to the active surface; an internal circuit formed in the active surface; an I/O chip pad formed on the active surface and connected to the internal circuit through an I/O buffer; and an I/O connection pad connected to the I/O chip pad through the I/O buffer by a circuit wiring. A redistributed I/O chip pad layer may be formed on the active surface of the first chip, the redistributed I/O chip pad layer redistributing the I/O chip pad. The I/O connection pads of the first chip and the second chip may be electrically connected to each other. The redistributed I/O chip pad layer of the first chip may be electrically connected to an external connection terminal.

According to an example embodiment, the redistributed I/O chip pad layer may be connected to a wiring substrate by a wire bonding, and the wire bonding may be electrically connected to the external connection terminal through internal wiring of the wiring substrate.

According to an example embodiment, a through electrode may be formed below the redistributed I/O chip pad layer in one of an edge region and a scribe region of the first chip, and the through electrode electrically connects the redistributed I/O chip pad layer to the external connection terminal.

According to an example embodiment, a test pad may be formed on the active surface of the first chip spaced apart from the I/O chip pad, and a through electrode formed in the substrate below the test pad is electrically connected to the external connection terminal.

According to an example embodiment, the first chip and the second chip may be stacked such that the inactive surface of the first chip faces the active surface of the second chip, and a through electrode may be formed in the substrate below the I/O connection pad of the first chip and the I/O connection pad of the second chip.

In an example embodiment, a stack chip package may include a first chip and a second chip stacked on the first chip. Each of the first and second chips may include a substrate having an active surface and an inactive surface opposite to the active surface; an internal circuit formed in the active surface; a I/O chip pad formed on the active surface and connected to the internal circuit through an I/O buffer; a ground chip pad connected to ground wiring of the internal circuit; an I/O connection pad connected to the I/O chip pad through the I/O buffer; and a ground connection pad connected to the ground chip pad. The ground connection pads of the first chip and the second chip may be electrically connected to each other by an electrical connecting part. The redistributed I/O chip pad layer and the redistributed ground chip pad layer of the first chip may be connected to external connection terminals.

In an example embodiment, a method of forming a chip stack may include stacking a second chip on a first chip, each of the first and second chips including a substrate, the substrate having an active surface and an inactive surface opposite to the active surface, an internal circuit formed in the substrate, an I/O chip pad formed on the active surface connected to the internal circuit through an I/O buffer, and an I/O connection pad connected to the I/O chip pad through the I/O buffer by a circuit wiring; forming a redistributed I/O chip pad layer on the active surface of the first chip, the redistributed I/O chip pad layer redistributing the I/O chip pad; and forming an electrical connection part to electrically connect the I/O connection pads of the first chip and the second chip.

According to an example embodiment, each of the first and second chips may include a ground chip pad connected to ground wiring of the internal circuit, and a ground connection pad connected to the ground chip pad. The method may further include forming a redistributed ground chip pad layer on the active surface of the first chip, the redistributed ground chip pad layer redistributing the ground chip pad; and forming an electrical connection part to electrically connect the ground connection pads of the first chip and the second chip.

In an example embodiment, a method of forming a chip stack package may include stacking a second chip on a first chip, each of the first and second chips including a substrate, the substrate having an active surface and an inactive surface opposite to the active surface, an internal circuit formed in the substrate, an I/O chip pad formed on the active surface connected to the internal circuit through an I/O buffer, and an I/O connection pad connected to the I/O chip pad through the I/O buffer by a circuit wiring; forming a redistributed I/O chip pad layer on the active surface of the first chip, the redistributed I/O chip pad layer redistributing the I/O chip pad; forming an electrical connection part to electrically connect the I/O connection pads of the first chip and the second chip; and forming an external connection terminal electrically connected to the redistributed I/O chip pad layer of the first chip.

In an example embodiment, a method of forming a chip stack package may include stacking a second chip on a first chip, each of the first and second chips including a substrate, the substrate having an active surface and an inactive surface opposite to the active surface, an internal circuit formed in the substrate, an I/O chip pad formed on the active surface connected to the internal circuit through an I/O buffer, a ground chip pad connected to ground wiring of the internal circuit, an I/O connection pad connected to the I/O chip pad through the I/O buffer by a circuit wiring, and a ground connection pad connected to the ground chip pad; forming a redistributed I/O chip pad layer on the active surface of the first chip, the redistributed I/O chip pad layer redistributing the I/O chip pad; forming a redistributed ground chip pad layer on the active surface of the first chip, the redistributed ground chip pad layer redistributing the ground chip pad; forming an electrical connection part to electrically connect the I/O connection pads and the ground connection pads of the first chip and the second chip; forming external connection terminals electrically connected to the redistributed I/O chip pad layer and the redistributed ground chip pad layer of the first chip.

BRIEF DESCRIPTION OF THE DRAWINGS

Example embodiments will be described with reference to the accompanying drawings.

DESCRIPTION OF EXAMPLE EMBODIMENTS

Figure 1:
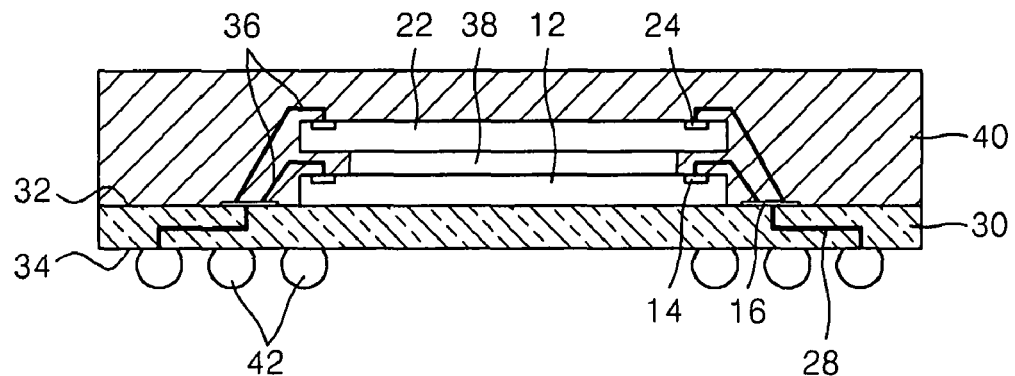
FIG. 1 is a sectional view of a conventional chip stack package.

Example embodiments will now be described more fully hereinafter with reference to the accompanying drawings. Example embodiments may, however, be embodied in many different forms and should not be construed as being limited to the example embodiments set forth herein. Rather, these example embodiments are provided so that this disclosure will be thorough, and will fully convey the scope to one skilled in the art. In the drawings, the thicknesses of layers and regions are exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
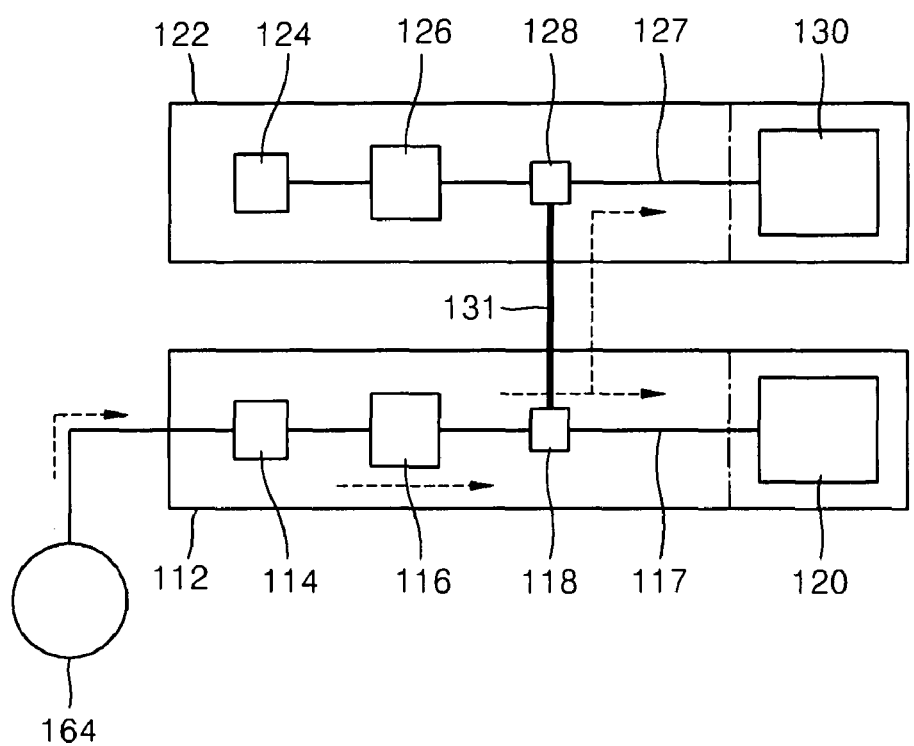
FIG. 2 is a circuit diagram schematically illustrating a chip stack according to an example embodiment.

FIG. 2 is a circuit diagram schematically illustrating a chip stack according to an example embodiment. The circuit diagram of the chip stack illustrated in FIG. 2 illustrates only the parts of the chip stack required for explanation.

Referring to FIG. 2, a chip stack may include a first chip 112 having a first internal circuit 120 and a second chip 122 having a second internal circuit 130. The first internal circuit 120 may be connected to the second internal circuit 130 through a first input/output (I/O) buffer 116, which may be connected to an external connection terminal 164.

The first chip 112 may include a first chip pad 114 and a first connection pad 118, and the second chip 122 may include a second chip pad 124 and a second connection pad 128. The first and second chip pads 114 and 124 may be used to bond with a package, and may be formed to a size and shape that may enable probing to be performed on the package. For example, the first and second chip pads 114 and 124 may be used to connect with the package, test the package, and the like. Conversely, the first and second connection pads 118 and 128 may not be used to enable probing with the package, and may be formed to mutually connect the stacked first and second chips 112 and 122.

The first chip pad 114, the first I/O buffer 116, the first connection pad 118, and the internal circuit 120 may be connected to each other by circuit wirings (interconnections) 117. The second chip pad 124, the second I/O buffer 126, the second connection pad 128, and the second internal circuit 130 may be connected to each other by circuit wirings (interconnections) 127. The first and second connection pads 118 and 128 may be connected to the first I/O buffer 116 and the internal circuits 120 and 130, respectively. The first and second connection pads 118 and 128 may be electrically connected by an electrical connection part 131. The first chip pad 114 of the first chip 112 may be electrically connected to the external connection terminal 164.

As shown by the arrow in the drawing, an input signal may be input to the first chip pad 114 of the first chip 112 through the external connection terminal 164, passed through the first I/O buffer 116 of the first chip 114, and input to the first internal circuit 120 or second internal circuit 130 through the first connection pad 118 or the second connection pad 128, respectively. For example, the input signal may be input to the first internal circuit 120 of the first chip 112 through the first chip pad 114, the first I/O buffer 116, and the first connection pad 118. The input signal may be input to the second internal circuit 130 of the second chip 122 from the first connection pad 118 of the first chip 112 through the second connection pad 128 of the second chip 122 via the electrical connection part 131.

An output signal may be output to the first I/O buffer 116 of the first chip 112 from the first or second internal circuits 120 or 130 of the first and second chips 112 and 122, respectively, and may be output to the external connection terminal 164 through the first chip pad 114 of the first chip 112. For example, the output signal of the first internal circuit 120 may be passed through the first I/O buffer 116 and the first chip pad 114, and output to the external connection terminal 164. The output signal of the second internal circuit 130 may be passed through the second connection pad 128 to the first connection pad 118 via the electrical connection part 131, and output to the external connection terminal 164 through the first I/O buffer 116 and the first chip pad 114 of the first chip 112. The second chip pad 124 and the second I/O buffer 126 of the second chip 122 may not be used as I/O terminals after the packaging of the stack package is completed.

A chip stack, according to an example embodiment, may have an improved operating speed that is approximately equal to or similar to the operating speed of a single embedded chip package. The chip stack may also have an increased device capacity because the input capacitance load from the external connection terminal 164 may be decreased to the level of a single embedded chip package.

The chip stack structure, according to an example embodiment, may include the first chip 112 and the second chip 122 stacked on the first chip 112. In the first chip pad 114 or 214 of the first chip 112, a redistributed chip pad 140 (FIGS. 5 and 6) may be formed in a scribe region (or scribe lane) or an edge region by a wafer level redistribution process, or a through electrode 302 (FIGS. 10 and 11) may be formed below the redistributed chip pad 140. Further, the chip stack structure may be connected to the external connection terminal 164 during a package process by forming a through electrode 404 (FIGS. 12 and 13) to connect to a test pad 402, without using the pads 114 and 214 of the first chip 112. Alternatively, the chip stack may be structured such that an active surface 111a of the first chip 112 and an active surface 121a of the second chip 122 are disposed to face towards each other. For example, the active surface 111a of the first chip 112 may be disposed upwards, and the active surface 121a of the second chip 122 may be disposed downwards.

The chip stack may include a chip pad that acts as ground (ground chip pad) 114c (FIG. 5) in addition to the of the chip pads 114 and 214 of the first chip 112. The ground chip pad 114c may be formed in various shapes. The ground chip pad 114c may also be redistributed to an edge region or a scribe region through a connection pad that acts as ground (ground connection pad) 118c, thereby forming a redistributed chip pad that acts as ground (redistributed ground chip pad) 146 (FIG. 5).

Figure 3:
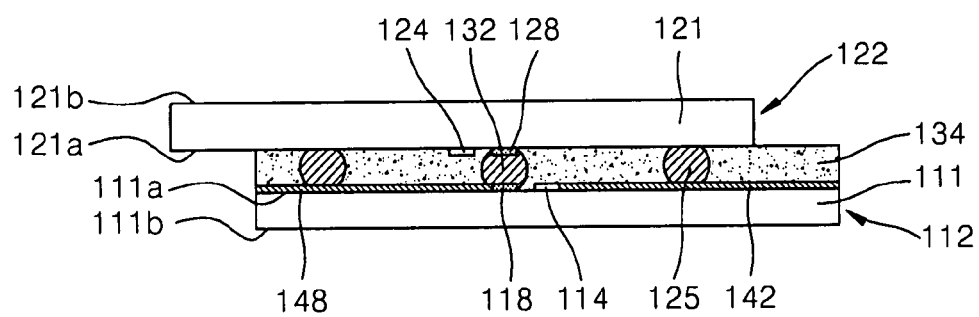
FIGS. 3 and 4 are sectional views of a chip stack according to an example embodiment.
Figure 4:
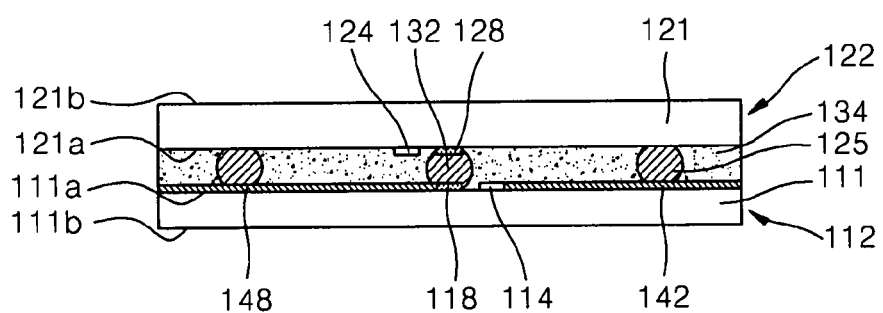
Figure 5:
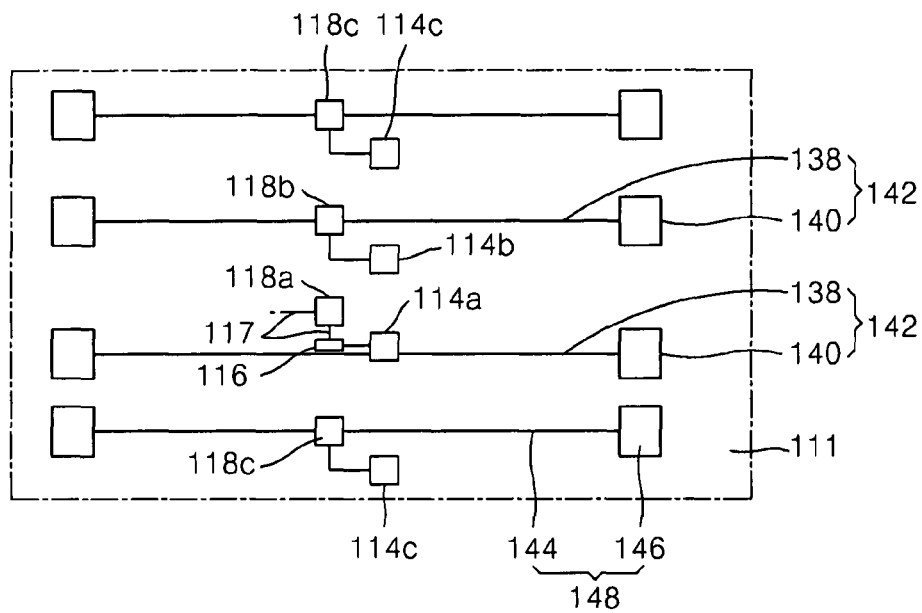
FIG. 5 is a plan view schematically illustrating the chip stack illustrated in FIGS. 3 and 4.

FIGS. 3 and 4 are sectional views of a chip stack according to an embodiment, and FIG. 5 is a plan view schematically illustrating the chip stack of FIGS. 3 and 4. As shown in FIGS. 3 and 4, a first chip pad 114 and a first connection pad 118 may be disposed on an active surface 111a of a first chip 112; however either one of the first chip pad 114 and the first connection pad 118 may be disposed on a substrate 111 according to the alignment of the first chip pad 114 and the first connection pad 118.

Referring to FIGS. 3 and 4, a chip stack may have a dual chip structure including a first chip 111 and a second chip 122. The first and second chips 111 and 122 may have active surfaces 111a and 121a having circuits and inactive surfaces 11b and 121b not having circuits. The first and second chips may be stacked such that the active surface 111a of the first chip 111 and the active surface 121a of the second chip are facing each other. The chip stack may be formed by stacking the first and second chips 112 and 122 on a first substrate 111 and a second substrate 121, respectively. The first and second substrates 11 and 121 may be, for example, silicon substrates. First and second connection pads 118 and 128 may be formed on the active surfaces 111a and 121a of the first and second chips 112 and 122, and the first and second connection pads 118 and 128 may be electrically connected by an electrical connection part, for example, a first conductive bump 132. A second conductive bump 125 may be disposed between the first chip 112 and the second chip 122. The second conductive bump 125 may be used as ground, or as a dummy bump supporting a portion between the first and second chips 112 and 122.

The first and second conductive bumps 132 and 125 may be protected by a filling layer 134 interposed between the stacked first and second chips 112 and 122. In order to connect the stacked first and second chips 112 and 122 to the external connection terminal 164 illustrated in FIG. 2, a redistributed chip pad layer that acts as an input and output (redistributed I/O chip pad layer) 142 may be formed connected to the first chip pad 114 of the first chip 112 using a wafer level redistribution process, and a redistributed chip pad layer that acts as ground (redistributed ground chip pad layer) 148 may be formed on the first connection pad 118 using a wafer level redistribution process. The redistributed I/O chip pad layer 142 and the redistributed ground chip pad layer 148 may be redistributed such that the first I/O chip pad 114 and the first connection pad 118 that are formed at the center of the chip are redistributed to an edge region or a scribe region. As such, if the first I/O chip pad 114 and the first connection pad 118 are redistributed, the chip stack package may be formed in various shapes. The wafer level redistribution process will be explained in detail later.

The chip stack may include the first and second chips 112 and 122 that are stacked such that the active surfaces 111a and 121a face each other. Because the redistributed I/O chip pad layer 142 and the redistributed ground chip pad layer 148 may be formed on the first chip 112, the first chip 112 will be explained more in detail. In the second chip 122, a second connection pad 128 may be formed to correspond to the first connection pad 118 of the first chip 112 and a redistributed ground chip pad layer (not shown) may be formed to correspond to the redistributed ground chip pad layer 148 of the first chip 112.

In the first chip 112, the first chip pad 114 and the first connection pad 118 may be formed on the active surface 111a of the substrate 111. The first chip pad 114 may be electrically connected to integrated circuits formed on the substrate 111. The first chip pad 114 may be composed of aluminum, copper having good electrical conductivity, and the like.

FIG. 5 is a circuit diagram schematically illustrating the chip stack illustrated in FIGS. 3 and 4.

Referring to FIG. 5, the first chip pad 114 may include I/O chip pads 114a and 114b, and a ground chip pad 114c. The I/O chip pad 114a may be a higher speed I/O chip pad in which a lower input capacity load is important in order to facilitate the higher operation speed, and the I/O chip pad 114b may be a lower speed chip I/O pad in which an increase of the input capacity load has less of an effect due to the lower operation speed. Only the higher speed I/O chip pad 114a of the first chip pad 114 may be connected to a first internal circuit 120 through a circuit wiring 117. Thus, the first I/O buffer 116 may be disposed between the higher speed I/O chip pad 114a and the circuit wiring 117.

A redistributed I/O chip pad layer 142 may be formed to connect to the first chip pad 114, using a wafer level redistribution process. The redistributed I/O chip pad layer 142 may connect the stacked chips to an external connection terminal 164 (FIG. 2). The redistributed I/O chip pad layer 142 may include a redistribution I/O chip layer 138 and a redistribution I/O chip pad 140. In the redistributed I/O chip pad layer 142 connected to the higher speed I/O chip pad 114a, the redistributed I/O chip pad layer 142 may also include the first I/O chip pads 114a and 114b as shown in FIGS. 3 and 4.

The first connection pad 118 may include I/O connection pads 118a and 118b, which are electrically connected to the I/O chip pads 114a and 114b, and a ground connection pad 118c electrically connected to the ground chip pad 114c. The I/O connection pad 118a may be connected to a circuit wiring 117 between the first I/O buffer 116 and the first internal circuit 120. The I/O connection pad 118a may be a higher speed I/O connection pad 118a connected to the higher speed I/O chip pad 114a, and a lower speed I/O connection pad 118b connected to the lower speed I/O chip pad for 114b. The ground connection pad 118c may be formed on the active surface 111a to be aligned in the same way as the I/O connection pads 118a and 118b.

The ground connection pad 118c may be connected to the redistributed ground chip pad layer 148, by a wafer level redistribution process. The redistributed ground chip pad layer 148 may be formed on both sides of the ground connection pad 118c as illustrated in FIG. 5, or may be formed on one side of the ground connection pad 118c as illustrated in FIGS. 3 and 4.

Referring to FIGS. 3 and 4 again, because the first chip pad 114 is aligned at the center portion of the active surface 111a of the substrate 111 of the first chip 112, the first connection pad 118 may be formed spaced apart from the first chip pad 114. For example, the first connection pad 118 may not be in the center portion of the substrate 111 of the first chip 112. Accordingly, the second chip 122 may be stacked on the first chip 112 in an "off-set" in order for the second connection pad 128 of the second chip 122 to be aligned with the first connection pad 118 of the first chip 112. Thus, the second chip 122 may be positioned off from the center of the first chip 112, as illustrated in FIG. 3. If the second chip 122 is off-set from the vertical expansion line along the center of the first chip 112, the size of the chip stack may become larger. For example, the amount of the off-set may be about 100 μm or less. The first connection pad 118 may be formed close to or adjacent to the first chip pad 114 to reduce the amount of off-set required.

As illustrated in FIG. 4, the first chip pad 114 may be formed spaced apart from the center portion of the substrate 111 as much as the off-set of the stack. For example, if the first connection pad 118 is formed at the center portion of the substrate 111, the first chip 112 and the second chip 122 may be stacked at the center of the substrate 111 without off-set.

The first connection pad 118 and the second connection pad 128, which may be disposed facing opposite to each other on the active surfaces 111a and 121a of the first chip 112 and the second chip 122, respectively, may be connected by a first conductive bump 132. The first conductive bump 132 may be a solder bump, a gold bump, a nickel bump, or the like. Because the active surfaces 111a and 121a of the first chip 112 and the second chip 122 are disposed to face each other in the chip stack, a distance between the first connection pad 118 and the second connection pad 128 may be reduced. A filling layer 134 may be formed between the first chip 112 and the second chip 122 to protect the first conductive bump 132. For example, the filling layer 134 may be epoxy or silicon resin. In the example embodiment shown in FIGS. 3 and 4, the electrical connection part 131 may be the first conductive bump 132, however the electrical connection part 131 may also be an anisotropic conductive film (not shown). If the anisotropic conductive film is used as the electrical connection part 131, a process of forming a separate filling layer may be omitted.

Figure 6:
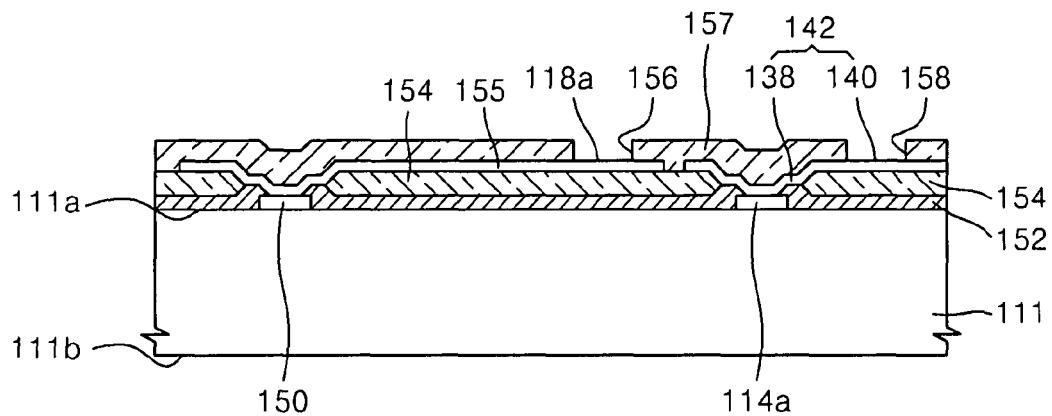
FIGS. 6 and 7 are sectional views of a redistributed chip pad layer and a chip pad layer as illustrated in FIGS. 3 and 4.
Figure 7:
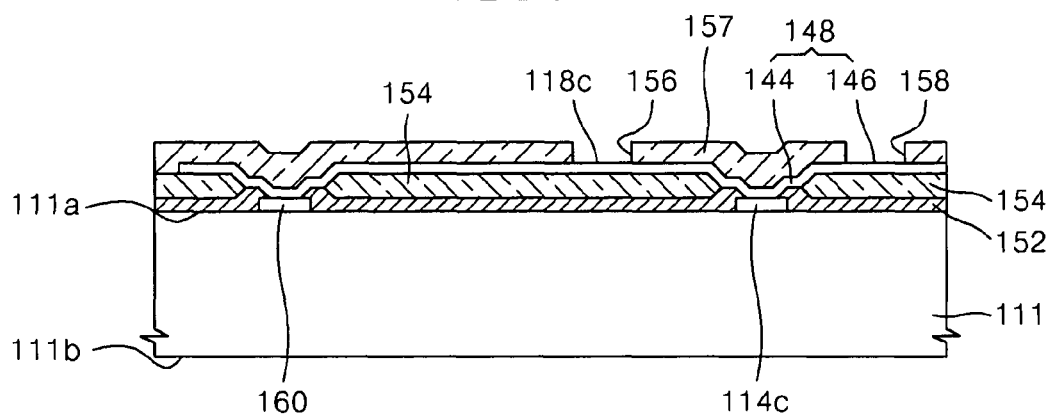

FIGS. 6 and 7 are sectional views illustrating a redistributed chip pad layer and a ground chip pad layer of FIGS. 3 and 4.

Referring to FIG. 6, the I/O chip pad 114a may be connected to the redistributed I/O chip pad layer 142 using a wafer level redistribution process. A medium pad 150 may be formed on the active surface 111a. The medium pad 150 may be connected to the circuit wiring 117 connecting the I/O buffer 116 and the first internal circuit 120. The medium pad 150 may be passed through the I/O buffer 116 and connected to the chip pad 114a formed on the active surface 111a. A protecting layer 152 may be formed on the active surface 111a, except for the portions over where the medium pad 150 and the I/O chip pad 114 are formed.

A first insulating layer 154 may be formed on the protecting layer 152, except for portions over where the medium pad 150 and the I/O chip pad 114a are formed. A redistributed connection pad layer 155 may be formed on the first insulating layer 154 including the medium pad 150. The redistributed I/O chip layer 138 may be formed on the first insulating layer 154 including the I/O chip pad 114a. The redistributed connection pad layer 155 and the redistributed I/O chip layer 138 may be spaced apart from each other. A second insulating layer 157 may be formed to protect the redistributed connection pad layer 155 and the redistributed I/O chip layer 138. The I/O connection pad 118a and the redistributed I/O chip pad 140 may be formed by forming openings 156 and 158 in the second insulating layer 157 to expose portions of the redistributed connection pad layer 155 and the redistributed I/O chip layer 138. The I/O connection pad 118a and the redistributed I/O chip pad 140 may be formed concurrently. Thus, the I/O chip pad 114a may be connected to the redistributed chip pad layer 142 using a wafer level redistribution process, so as to redistribute the I/O chip pad 114a to an edge region or a scribe region of the chip.

Referring to FIG. 7, the ground chip pad 114c may be connected to the redistributed ground chip pad layer 148 using a wafer level redistribution process. The ground chip pad 114c may be directly connected to a redistributed chip layer that acts as ground (redistributed ground chip layer) 144 formed by the redistribution process. The redistributed ground chip 144 may be connected to a power ground wiring (interconnection) of the internal circuit 120, and to a connection pad 160 formed on the active surface 111a. The second insulating layer 157 may be formed on the redistributed ground chip layer 144. The ground connection pad 118c and the redistributed ground chip pad 146 may be formed by forming openings 156 and 158 in the second insulating layer 157. The ground connection pad 118c and the redistributed ground chip pad 146 may be formed concurrently. The redistributed ground chip layer 144 may be wider compared to the redistributed I/O chip layer 138 in order to achieve stable power supply and ground. For example, the redistributed ground chip layer 144 may have a curvy shape or a spiral shape.

Figure 8:
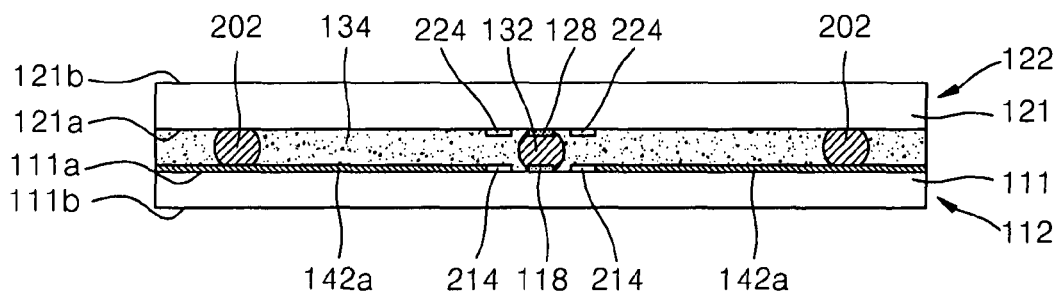
FIGS. 8 and 9 are sectional views of a chip stack according to example embodiments.
Figure 9:
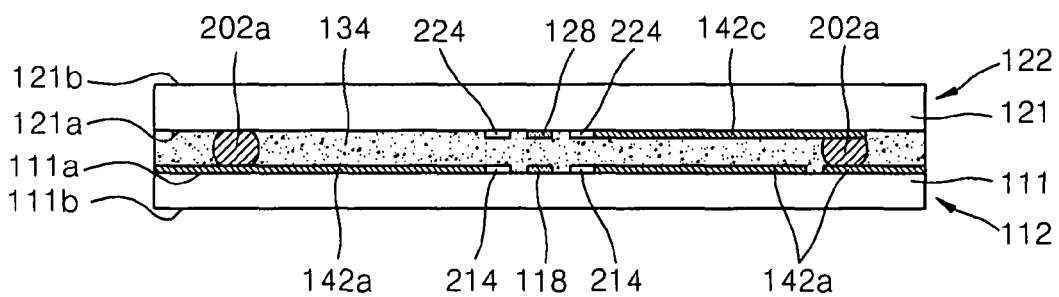

FIGS. 8 and 9 are sectional views of a chip stack according to other example embodiments. A chip stack according to example embodiments as shown in FIGS. 8 and 9 is similar to the chip stack according to example embodiments in FIGS. 3 and 4, except that in FIGS. 8 and 9, first chip pads 214 and second chip pads 224 are aligned in two lines on opposite sides of a first connection pad 118 and a second connection pad 128, respectively.

Referring to FIG. 8, the chip stack may include a first chip 112 and a second chip 122, which are stacked such that the active surfaces 111a and 121a of the first and second chips 112 and 122 are facing each other. Because both the first chip 112 and the second chip 122 include first and second chip pads 214 and 224 and first and second connection pads 118 and 128, respectively, only the first chip 112 will be described below.

The first chip pads 214 may be formed in two lines at the center portion of the active surface 111a of the first chip 112. The first connection pad 118 may be formed between the first chip pads 214 at the center of the substrate 111. Like the redistributed chip pad layer 142 of the embodiment of FIGS. 3 and 4, the first chip pad 214 formed at the center portion of the substrate 111 may be connected to a redistributed chip pad layer 142a, by a wafer level redistribution process, and may be redistributed to an edge region or a scribe region of the substrate 111. Conductive bumps 202 may be formed on opposite ends of the first chip 112. The conductive bumps 202 may be bumps that act as a ground or dummy bumps supporting the first chip 112 and the second chip 122.

Referring to FIG. 9, the first chip 112 and the second chip 122 may include first chip pads 214 and second chip pads 224, respectively, which are not shared in the chip stack structure. For example, the first chip pads 214 and second chip pads 224 may not be directly electrically connected. In this structure, the connection pad 128 of FIG. 8 is not necessary, and the redistributed chip pad layer 142a formed in the first chip, and a redistributed chip pad layer 142c formed in the second chip 122 may be connected using a conductive bump 202a. As a result, the present invention can provide various shapes of a pad structure using the redistributed chip pad layer 142a.

Figure 10:
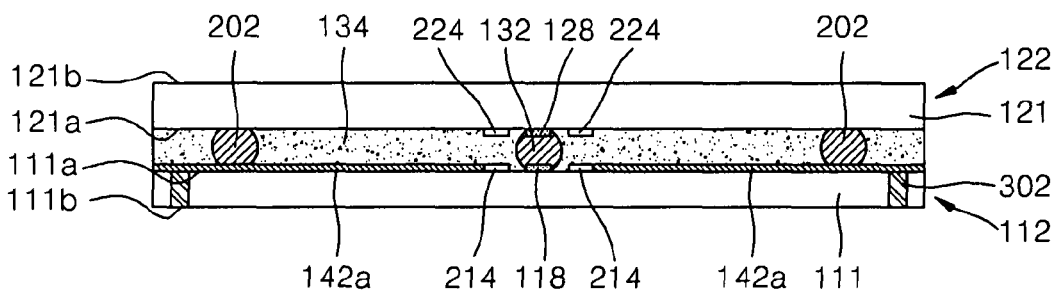
FIGS. 10 and 11 are sectional views of a chip stack according to example embodiments.
Figure 11:
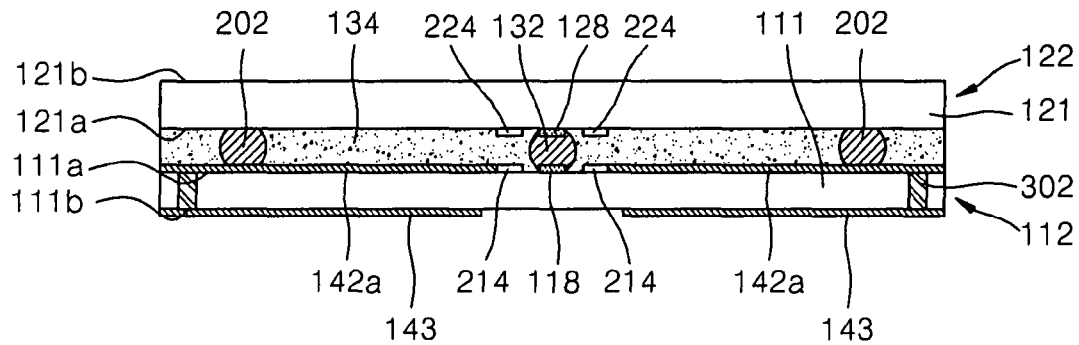

FIGS. 10 and 11 are sectional views of a chip stack according to other example embodiments. A chip stack according to example embodiments of FIGS. 10 and 11 may be similar to those of the example embodiments of FIGS. 3, 4 and FIGS. 8 and 9, except that a through electrode 302 may be formed below a redistributed chip pad layer 142a of a first chip 112.

Referring to FIGS. 10 and 11, the chip stack may include a first chip 112 and a second chip 122, which are stacked such that active surfaces 111a and 121a of the first and second chips 112 and 122 are facing each other. The first chip 112 and the second chip 122 may include first and second chip pads 214 and 224 and first and second connection pads 118 and 128 in the same way as that of the example embodiment of FIGS. 8 and 9. The first chip pad 214 may be connected to a redistributed chip pad layer 142a using a wafer level redistribution process described above. The first chip pad 214 formed at the center portion of the first chip 112 may be redistributed to an edge region or a scribe region of the substrate 111 by the redistributed chip pad layer 142a.

A through electrode 302 may be formed below the redistributed chip pad layer 142a. The through electrode 302 may be connected to an external connection terminal in the fabrication of a package. If the through electrode 302 is formed, the thickness of the first substrate 111 of the first chip 112 may be thinner than that of the second substrate 121.

As shown in FIG. 11, a wiring (interconnection) layer 143 may be formed on the inactive surface 111b of the first chip 112. The wiring layer 143 formed on the inactive surface may be connected to an external connection terminal 164 in the fabrication of a package.

Figure 12:
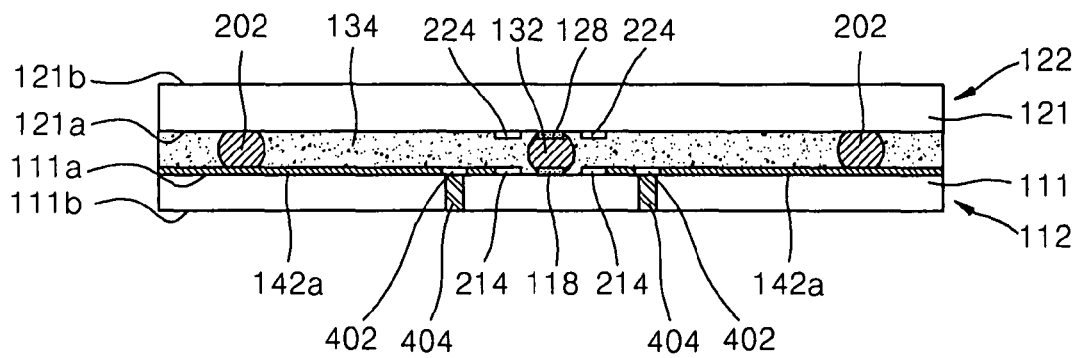
FIGS. 12 and 13 are sectional views of a chip stack according to example embodiments.
Figure 13:
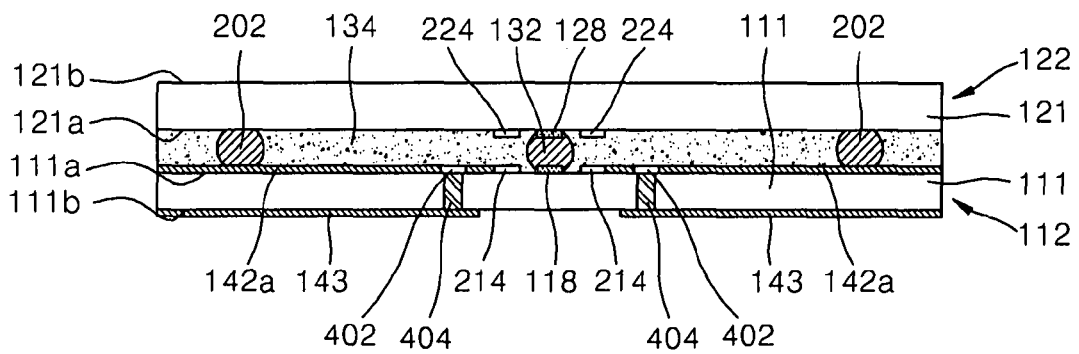

FIGS. 12 and 13 are sectional views of a chip stack according to example embodiments. A chip stack according to example embodiments as shown in FIGS. 12 and 13 may be similar to the example embodiments of FIGS. 10 and 11, except that a through electrode 404 is formed through the substrate 111 of the first chip 112. For example, the through electrode 404 may be formed below a test pad 402, rather than in an edge region of the first chip 112.

Referring to FIGS. 12 and 13, the chip stack may include a first chip 112 and a second chip 122, which are stacked such that the active surfaces 111a and 121a of the first and second chips 112 and 122 are facing each other. The first chip 112 and the second chip 122 may include first and second chip pads 214 and 224 and first and second connection pads 118 and 128, respectively, in the same way as the other example embodiments.

The first chip pad 214 may be connected to a redistributed chip pad layer 142a, by a wafer level redistribution process, as shown in the example embodiment of FIGS. 3 and 4. A test pad 402 may be formed adjacent or close to the chip pad 214 on the first chip 112. The first chip 112 may be used to connect the chip stack to an external connection terminal 164 through the test pad 402. The test pad 402 may be a pad that is used to test the electrical connection after a wafer level redistribution process, for example, an EDS pad, and may not be used after packaging. Thus, the first chip 112 may be connected to the external connection terminal 164 using the test pad 402 and the through electrode 404. If the through electrode 404 is provided, the thickness of the first substrate 111 used to form the first chip 112 may be thinner than the second substrate 121 of the second substrate 121.

FIG. 13 illustrates a wiring layer 143 that may be formed on an inactive surface 111b of the first chip 112 as illustrated in FIG. 11. The wiring layer 143 formed on the inactive surface 111b may be used to connect the chip stack to an external connection terminal 164.

Figure 14:
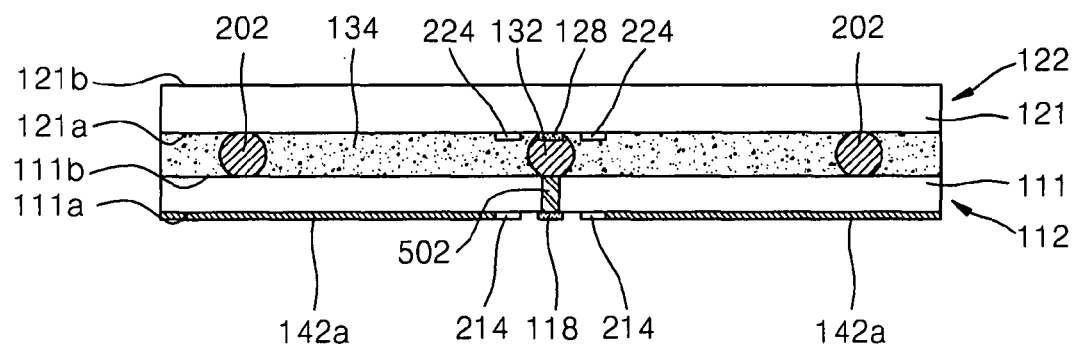
FIG. 14 is a sectional view of a chip stack according to an example embodiment.

FIG. 14 is a sectional view of a chip stack according to an example embodiment.

Referring to FIG. 14, a chip stack may include a first chip 112 and a second chip 122. An active surface 111a of a first chip 112 may be directed downward, and an active surface 121a of a second chip 122 may face an inactive surface 111b of the first chip 112. For example, the active surfaces 111a and 121a of the first chip 112 and the second chip 122 do not face to each other. The first chip 112 and the second chip 122 may include first and second chip pads 214 and 224 and first and second connection pads 118 and 128, respectively. Except for the structure described above, the chip stack according to an example embodiment of FIG. 14 is similar to those of the example embodiments of FIGS. 10 and 11.

A through electrode 502 may be formed through the substrate 111 of the first chip 112 below the connection pad 118. If the through electrode 502 is provided, the thickness of the first substrate 111 of the first chip 112 may be thinner than of the second substrate 121 of the second chip 122. The first connection pad 118 of the first chip 112 may be connected to the second connection pad 128 of the second chip 122 via the through electrode 502 and a conductive bump 132.

If the chip pad 214 is connected to the redistributed chip pad layer 142a using a wafer level redistribution process, various shapes of chip stacks may be formed.

Figure 15:
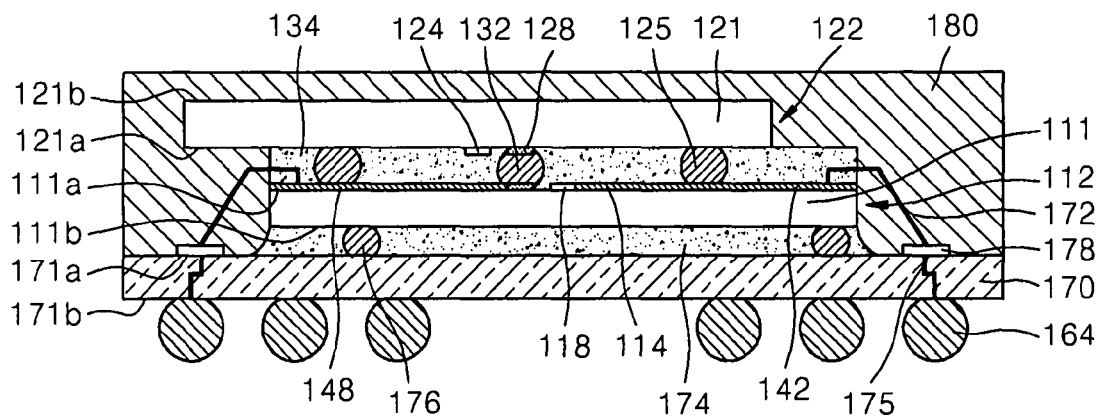
FIGS. 15 and 16 are sectional views of a chip stack package according to example embodiments.
Figure 16:
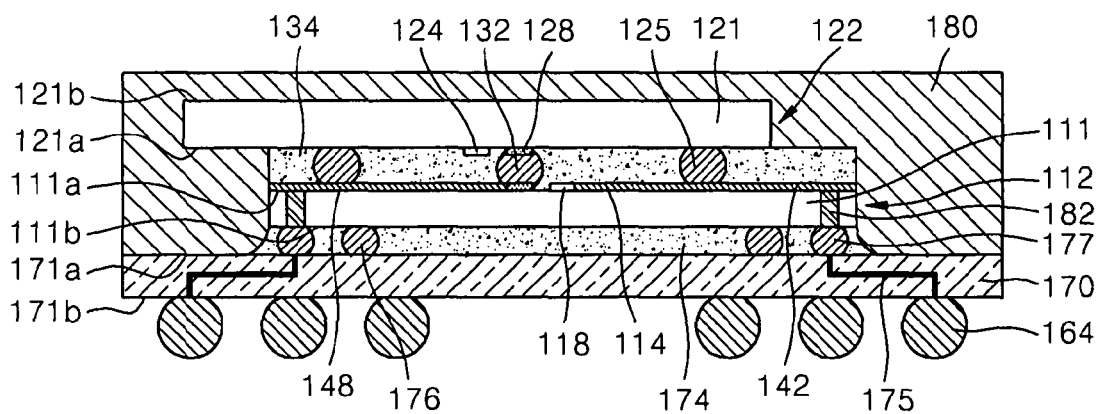

FIGS. 15 and 16 are sectional views of a chip stack package according to example embodiments. The chip stack package of FIGS. 15 and 16 may include a chip stack similar to the example embodiment of FIG. 3.

Referring to FIGS. 15 and 16, the chip stack package may be a ball grid array (BGA), in which a first chip 112 of a chip stack is disposed on an upper surface 171a of a wiring (interconnection) substrate 170.

A filling layer 174 may be interposed between the first chip 112 of the chip stack and the wiring substrate 170. For example, the filling layer 174 may be formed between an upper surface 171a of the wiring substrate and an inactive surface 111b of the first chip 112. A spacer 176 may be formed between the upper surface 171a of the wiring substrate 170 and the first chip 112, such that the chip stack may be stably mounted on the upper surface 171a of the wiring substrate 170. The filling layer 174 and/or the spacer 176 may not be formed if not necessary.

The wiring substrate 170 may be a printed circuit board, a tape wiring (interconnection) board, a ceramic wiring (interconnection) board, a silicon wiring (interconnection) board, a lead frame, and the like. A molding compound 180, for example, a resin molding compound, may be formed over the chip stack mounted on the upper surface 171a of the wiring substrate 170, to protect the upper surface of the wiring substrate 170 from the external environment.

External connection terminals 164 may be formed on a lower surface 171b of the wiring substrate 170. For example, the external connection terminals 164 may be solder balls. The external connection terminals 164 may be connected to a wiring (interconnection) pad 178 (FIG. 15) or a bonding bump 177 (FIG. 16) through an internal wiring 175 of the wiring substrate 170. The wiring pad 178 or bonding bump 177 may be connected to a redistributed I/O chip pad layer 142 of the first chip 112 and/or a redistributed ground chip pad layer 148 by a bonding wire 172 (FIG. 15) or a through electrode 182 (FIG. 16), respectively.

A first connection pad 118 of the first chip 112 and a second connection pad 128 of the second chip 122 may be electrically connected by a conductive bump 132. The redistributed chip pad layer 142, which is connected to the first chip pad 114 of the first chip 112 by the wafer level redistribution process, may be electrically connected to the external connection terminal 164. Therefore, an input signal may be input to the first chip pad 114 of the first chip 112 through the external connection terminal 164, and may be input to internal circuits 120 or 130 of the first chip 112 and the second chip 122 through the first and second connection pads 118 and 128, which are connected by an I/O buffer 116 of the first chip 112. Thus, because the input capacity loading of the chip stack package from the view of the external connection terminal 164 may be decreased to that of a single chip package, an operating speed may be maintained at approximately equal to or similar to that of the single chip package and the capacity may be increased by about two times that of the single chip package.

Figure 17:
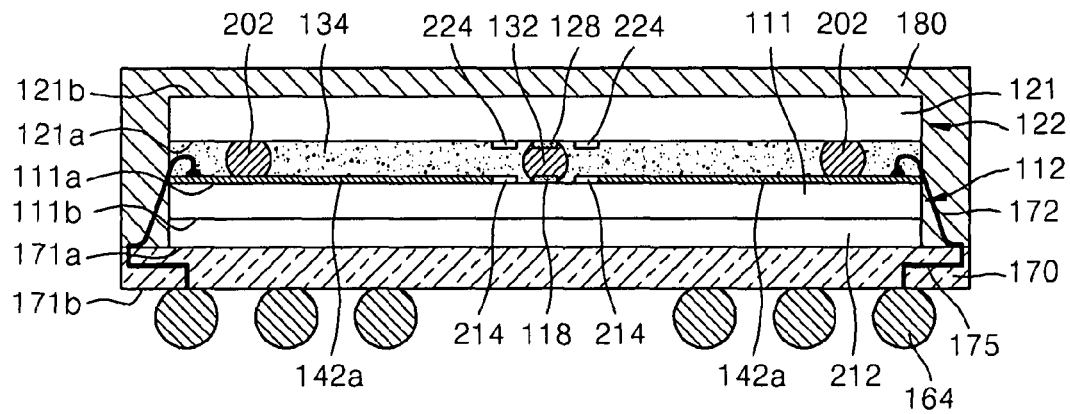
FIGS. 17 through 19 are sectional views of a chip stack package according to example embodiments.
Figure 18:
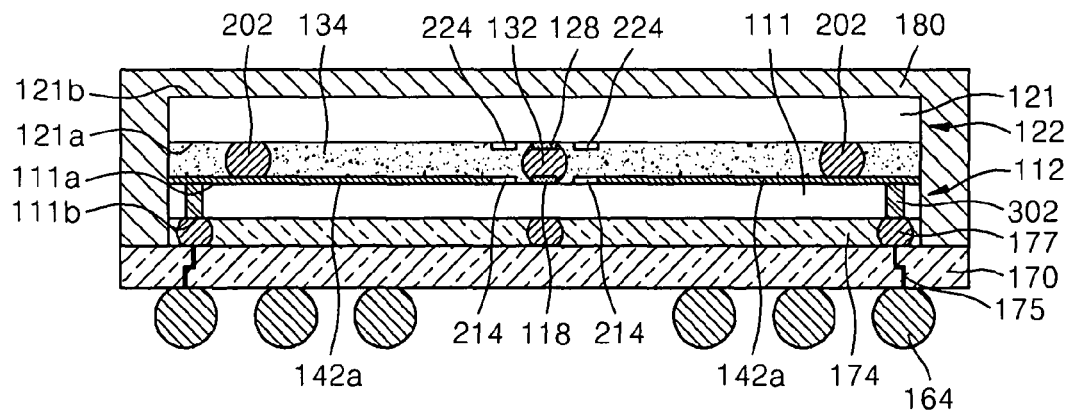
Figure 19:
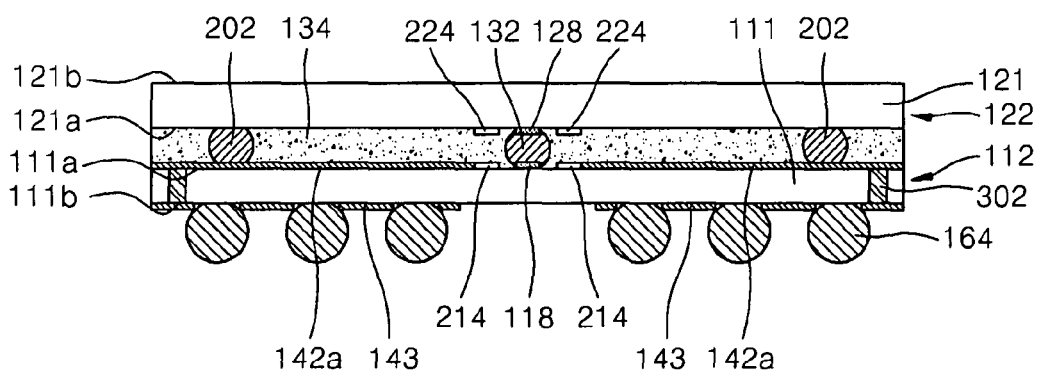

FIGS. 17 through 19 are sectional views of a chip stack package according to example embodiments.

Referring to FIGS. 17 and 18, the chip stack package may be similar to the chip stack packages of example embodiments as shown in FIGS. 15 and 16, except that the chip pads may be formed at opposite sides of the connection pads 118 and 128. The chip stack package may be a ball grid array (BGA), in which the chip stack is bonded to an upper surface 171a of a wiring substrate 170 using a wire bonding 172 or a through electrode 302. External connection terminals 164 may be formed on a lower surface 171b of the wiring substrate 170. The external connection terminals 164 may be electrically connected to a wire bonding 172 or a bonding bump 177 through an internal wiring 175 of the wiring substrate 170.

Referring to FIG. 19, the chip stack may be similar to the chip stack package of an example embodiment as shown in FIG. 11. The chip stack package may be a wafer level package (WLP), in which an external connection terminal 164 may be formed on an inactive surface (rear surface) 111b of a first chip 111. Thus, the chip stack package may not include a wiring substrate 170 as shown in the example embodiment of FIGS. 17 and 18. In order to fabricate the wafer level package of FIG. 19, a wiring layer 143 may be formed on an inactive surface of the first chip 112.

Figure 20:
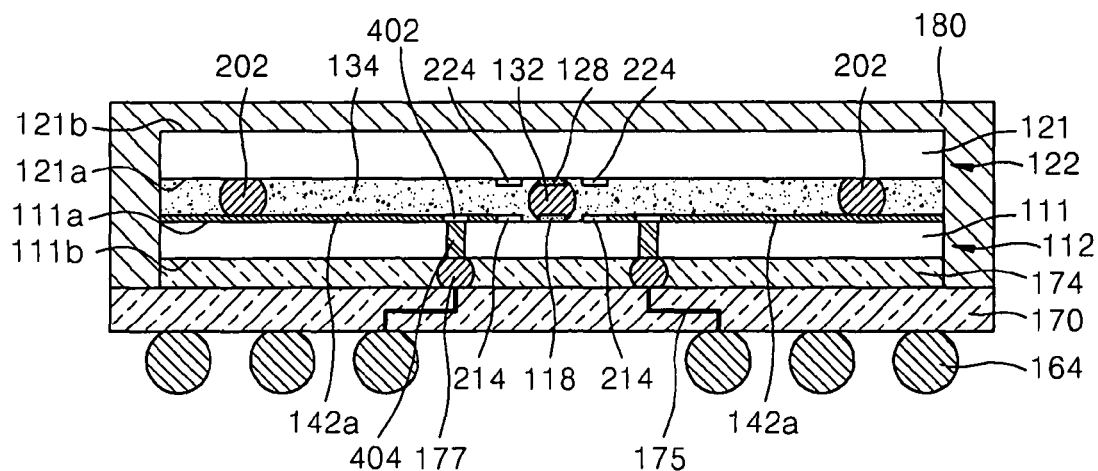
FIGS. 20 and 21 are sectional views of a chip stack package according to example embodiments.
Figure 21:
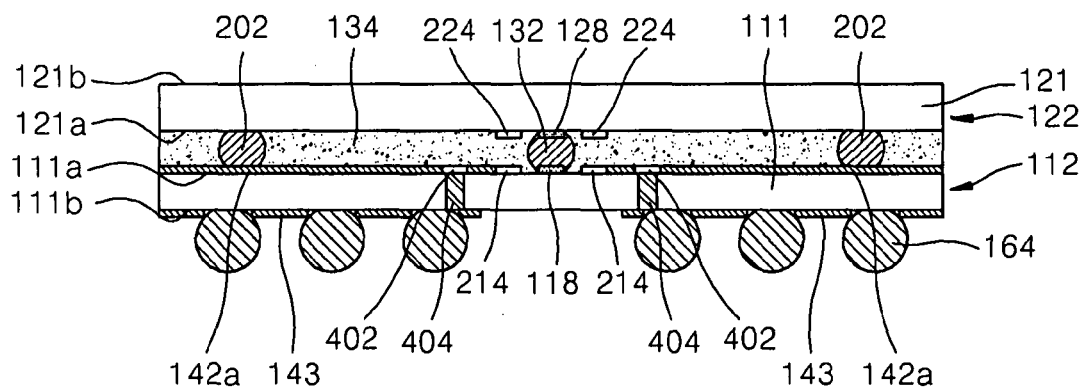

FIGS. 20 and 21 are sectional views of a chip stack package according to example embodiments.

Referring to FIGS. 20 and 21, a chip stack package may include the chip stack of FIGS. 12 and 13, respectively. The chip stack package according to example embodiments of FIGS. 20 and 21 may be similar to the chip stack package of FIGS. 18 and 19, except that a through electrode 404 may be formed through a first substrate 111 of the first chip 112. For example, in the chip stack package of FIGS. 20 and 21, the through electrode 404 may be formed below a test pad 402, rather than in a scribe region or an edge region of a first chip.

Referring to FIG. 20, the chip stack package may be a ball grid array (BGA), in which the chip stack may be bonded to an upper surface 171a of a wiring substrate 170. External connection terminals 164 may be formed on a lower surface 171b of the wiring substrate 170. The external connection terminals 164 may be electrically connected to the chip stack via a through electrode 404 and a bonding bump 177. In FIG. 20, the external connection terminal 164 may be connected to the bonding bump 177 through an internal wiring 175 of the wiring substrate 170.

Referring to FIG. 21, the chip stack package may include a chip stack similar to the example embodiment of FIG. 13. The chip stack package may be a wafer level package in which an external connection terminal 164 may be formed on an inactive surface 111b (rear surface) of a first chip 111. Thus, the chip stack package may not include a wiring substrate 170, as shown in the example embodiment of FIG. 20. In order to fabricate the wafer level package of FIG. 21, a wiring layer 143 may be formed on the inactive surface 111b of the first chip 112.

Figure 22:
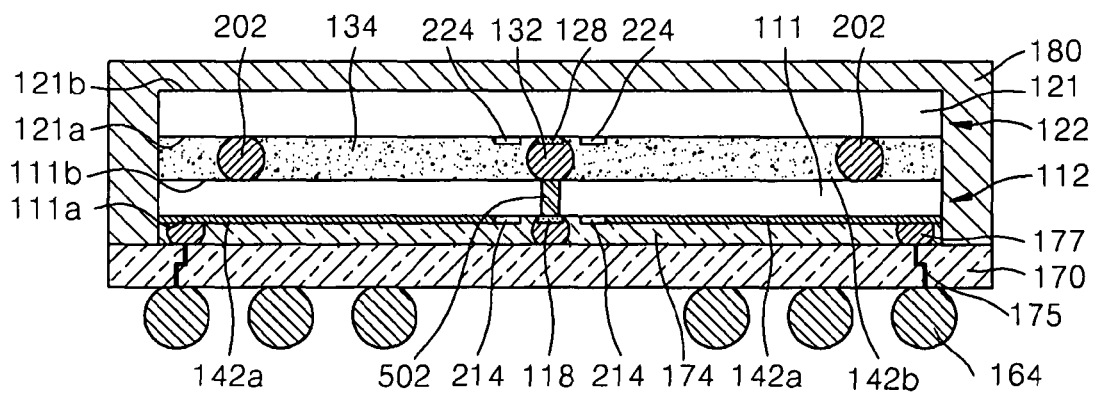
FIG. 22 is a sectional view of a chip stack package according to an example embodiment.

FIG. 22 is a sectional view of a chip stack package according to an example embodiment.

Referring to FIG. 22, the chip stack package may include a chip stack similar to the example embodiment of FIG. 14. The chip stack package of FIG. 22 may be similar to the example embodiment as shown in FIG. 18, except that an inactive surface 111b of a first chip 112 disposed on a wiring substrate 170 may be directed upward, and an active surface 121a of a second chip 122 may be directed downward. For example, the active surfaces 111a and 121a of the first chip 112 and second chip 122, respectively, may not be facing each other.

In an example embodiment, the chip stack package may be a ball grid array (BGA), in which a chip stack may be bonded to an upper surface 171a of the wiring substrate 170 using a bonding bump 177. External connection terminals 164 may be formed on a lower surface 171b of the wiring substrate 170. A through electrode 502 may be formed through the first substrate 111 of the first chip 112, below the first connection pad 118. The first connection pad 118 may be connected to a second connection pad 128 through a conductive bump 132.

The external connection terminal 164 may be connected to a bonding bump 177 through an internal wiring 175 of the wiring substrate 170.

In another example embodiment, the chip stack package may be a wafer level package, in which an external connection terminal 164 may be directly formed on an inactive surface 111b (rear surface) of the first chip 111. Thus, the chip stack package may not include a wiring substrate 170, as shown in the example embodiment of FIG. 21.

Example embodiments may provide a chip stack including a connection pad connecting a first chip and a second chip. One chip pad may be connected to one external connection terminal. Accordingly, input capacity loading from the view of the external connection terminal may be decreased to that of a single chip, thereby increasing the device capacity by about two times while providing increased operating speed equal to or similar to that of the single chip.

Example embodiments may provide a chip stack of including a redistributed chip pad that may be redistributed to a scribe region or an edge region using a wafer level redistribution process. If the redistributed chip pad is formed as above, the chip stack may be realized in various forms.

Example embodiments may provide various forms of chip stack packages by connecting a chip pad to the redistributed chip pad layer using a wafer level redistribution process, and connecting the redistributed chip pad layer to an external connection terminal.

While example embodiments have been particularly shown and described, it will be understood by those of ordinary skill in the art that various changes in form and details may be made therein without departing from the spirit and scope of the present invention.

What is claimed is:

1. A chip stack, comprising:
a first chip and a second chip stacked on the first chip, each of the first and second chips including,
a substrate having an active surface and an inactive surface opposite to the active surface,
an internal circuit in the substrate,
an input/output (I/O) chip pad on the active surface and connected to the internal circuit through an I/O buffer, and
an I/O connection pad connected to the I/O chip pad through the I/O buffer by a circuit wiring, the I/O connection pad being electrically between the I/O buffer and the internal circuit; and
a redistributed I/O chip pad layer on the active surface of the first chip, the redistributed I/O chip pad layer redistributing the I/O chip pad,
wherein the I/O connection pads of the first chip and the second chip are electrically connected to each other by an electrical connecting part.

2. The chip stack of claim 1, wherein the I/O chip pad on the active surface of the second chip and the I/O buffer on the active surface of the second chip are not an I/O terminal.

3. The chip stack of claim 1, wherein a test pad is spaced apart from the I/O chip pad of the first chip, and a through electrode is in the substrate below the test pad.

4. The chip stack of claim 1, wherein the first and second chip are stacked such that the inactive surface of the first chip faces the active surface of the second chip.

5. The chip stack of claim 4, wherein a through electrode is in the substrate below the I/O connection pad of the first chip, the through electrode being connected to the I/O connection pad of the second chip.

6. The chip stack of claim 1, wherein the I/O chip pad is at a center portion of the substrate of the first chip, and the redistributed I/O chip pad layer includes a redistributed chip pad which redistributes the I/O chip pad to one of an edge region and a scribe region of the substrate.

7. The chip stack of claim 6, wherein a through electrode is in the substrate below the redistributed I/O chip pad of the first chip.

8. The chip stack of claim 1, wherein the first chip and the second chip are stacked such that the active surface of the first chip faces the active surface of the second chip.

9. The chip stack of claim 8, wherein the I/O chip pad is located at the center portion of the first chip and the I/O connection pad is spaced apart from the I/O chip pad of the first chip, and wherein the first chip and the second chip are stacked in an off-set so that the I/O connection pad of the second chip is aligned with the I/O connection pad of the first chip.

10. The chip stack of claim 8, wherein the I/O connection pad is at the center portion of the first chip and the I/O chip pad is spaced apart from the center portion of the first chip, and wherein the first chip and the second chip are stacked without an off-set so that the I/O connection pad of the first and second chips are aligned at the center of the substrate.

11. The chip stack of claim 8, wherein a plurality of the I/O chip pads are aligned in one line at the center portion of the substrate, and the I/O connection pad is between the I/O chip pads.

12. The chip stack of claim 8, wherein a plurality of the I/O chip pads are aligned in two lines at the center portion of the substrate, and the I/O connection pad is between the two lines of the I/O chip pads.

13. A chip stack package, comprising:
the chip stack of claim 1,
wherein the redistributed I/O chip pad layer of the first chip is electrically connected to an external connection terminal.

14. The chip stack package of claim 13, wherein the redistributed I/O chip pad layer is connected to a wiring substrate by a wire bonding, and the wire bonding is electrically connected to the external connection terminal through internal wiring of the wiring substrate.

15. The chip stack package of claim 13, wherein a test pad is on the active surface of the first chip spaced apart from the I/O chip pad, and a through electrode in the substrate below the test pad electrically connects the test pad and the external connection terminal.

16. The chip stack package of claim 13, wherein the first chip and the second chip are stacked such that the inactive surface of the first chip faces the active surface of the second chip, and a through electrode in the substrate below the I/O connection pad of the first chip electrically connects the I/O connection pad of the first chip and the I/O connection pad of the second chip.

17. The chip stack package of claim 13, wherein a through electrode is below the redistributed I/O chip pad layer in one of an edge region and a scribe region of the first chip, and the through electrode electrically connects the redistributed I/O chip pad layer to the external connection terminal.

18. The chip stack package of claim 17, wherein a conductive bump is to connect the through electrode to a wiring substrate, and internal wiring of the wiring substrate electrically connects the through electrode and the external connection terminal.

19. The chip stack package of claim 17, wherein a wiring layer on the inactive surface of the first chip electrically connects the through electrode and the external connection terminal.

20. The chip stack of claim 1, wherein each of the first and second chips includes,
  a ground chip pad connected to ground wiring of the internal circuit, and
  a ground connection pad connected to the ground chip pad; and
  wherein a redistributed ground chip pad layer is on the active surface of the first chip, the redistributed ground chip pad layer redistributing the ground chip pad, and
  wherein the ground connection pads of the first chip and the second chip are electrically connected to each other by an electrical connecting part.

21. The chip stack of claim 20, wherein the redistributed ground chip pad layer is connected to the ground connection pad and ground wiring of the internal circuit.

22. The chip stack of claim 20, wherein the ground connection pad is at the center portion of the substrate, and the redistributed ground chip pad layer includes a redistributed ground chip pad which redistributes the ground connection pad to one of an edge region and a scribe region of the substrate.

23. The chip stack of claim 20, wherein the I/O connection pad is at the center portion of the substrate, and the redistributed I/O chip pad layer includes a redistributed I/O chip pad which redistributes the I/O chip pad to one of an edge region and a scribe region of the substrate.

24. A chip stack package, comprising:
  the chip stack of claim 20,
  wherein the redistributed I/O chip pad layer and the redistributed ground chip pad layer of the first chip are connected to external connection terminals.

25. The chip stack package of claim 24, wherein the redistributed I/O chip pad layer and the redistributed ground chip pad layer are connected to a wiring substrate by a wire bonding, and the redistributed I/O chip pad layer and the redistributed ground chip pad layer are connected to the external connection terminal through internal wiring of the wiring substrate.

26. The chip stack package of claim 24, wherein test pads are on the active surface of the first chip spaced apart from the I/O chip pad, and through electrodes connected to the external connection terminal are in the substrate below the test pads.

27. The chip stack package of claim 24, wherein the first chip and the second chip are stacked such that the inactive surface of the first chip faces the active surface of the second chip, and through electrodes are in the substrate below the I/O connection pad and the ground connection pad of the first chip electrically connecting the I/O connection pad and ground connection pad of the first chip to the I/O connection pad and ground connection pad of the second chip, respectively.

28. The chip stack package of claim 24, wherein through electrodes are below the redistributed I/O chip pad layer in one of edge regions and scribe regions of the first chip, and the redistributed I/O chip pad layer and the redistributed ground chip pad layer are connected to the external connection terminals through the through electrode.

29. The chip stack package of claim 28, wherein the through electrodes are connected to a wiring substrate by conductive bumps, and the redistributed I/O chip pad layer and the redistributed ground chip pad layer are connected to the external connection terminals through the through electrodes, the conductive bumps, and wiring of the wiring substrate.

30. The chip stack package of claim 28, wherein the through electrodes are connected to wiring layers on the inactive surface of the first chip, and the redistributed I/O chip pad layer and the redistributed ground chip pad layer are connected to the external connection terminals through the through electrodes and the wiring layers.

31. A chip stack, comprising:
  a first chip including a first internal circuit, a first chip pad, a first I/O buffer, and a first connection pad; and
  a second chip including a second internal circuit, a second chip pad, a second I/O buffer, and a second connection pad that is configured to be electrically connected to the first connection pad,
  wherein the first internal circuit and the first I/O buffer are configured to be electrically connected via the first connection pad and the second internal circuit is configured to be electrically connected to the second connection pad.

32. The chip stack of claim 31, wherein the second internal circuit is configured to receive an electrical signal from an external connection terminal via the first chip pad, the first I/O buffer, the first connection pad, and the second connection pad.

33. The chip stack of claim 31, wherein the first chip and the second chip are stacked such that the active surface of the first chip faces the active surface of the second chip.

34. The chip stack of claim 33, wherein the first chip pad is located at the center portion of the first chip and the first connection pad is spaced apart from the first chip pad, and wherein the first chip and the second chip are stacked off-set so that the second connection pad of the second chip is aligned with the first connection pad of the first chip.

35. The chip stack of claim 31, wherein each of the first and second chips includes,
  a ground chip pad connected to a ground wiring of the internal circuit,
  a ground connection pad connected to the ground chip pad, and
  wherein a redistributed ground chip pad layer is on the active surface of the first chip, the redistributed ground chip pad layer redistributing the ground chip pad, and
  wherein the ground connection pads of the first chip and the second chip are configured to be electrically connected to each other by an electrical connecting part.

36. The chip stack of claim 35, wherein the redistributed ground chip pad layer is configured to connect the ground connection pad and the ground wiring of the internal circuit.

37. A method of forming a chip stack, comprising:
  stacking a second chip on a first chip, each of the first and second chips including,
    a substrate, the substrate having an active surface and an inactive surface opposite to the active surface,
    an internal circuit formed in the substrate,
    an I/O chip pad formed on the active surface and connected to the internal circuit through an I/O buffer, and
    an I/O connection pad connected to the I/O chip pad through the I/O buffer by a circuit wiring, the I/O connection pad being electrically between the I/O buffer and the internal circuit;
  forming a redistributed I/O chip pad layer on the active surface of the first chip, the redistributed I/O chip pad layer redistributing the I/O chip pad, and
  forming an electrical connection part to electrically connect the I/O connection pads of the first chip and the second chip.

38. The method of claim 37, further comprising:
  forming a test pad spaced apart from the I/O chip pad of the first chip; and
  forming a through electrode in the substrate below the test pad.

39. The method of claim 37, wherein stacking the second chip on the first chip includes stacking the first and second chips such that the inactive surface of the first chip faces the active surface of the second chip.

40. The method of claim 37, further comprising:
forming a through electrode in the substrate below the I/O connection pad of the first chip that connects to the I/O connection pad of the second chip.

41. The method of claim 37 wherein the I/O chip pad on the active surface of the second chip and the I/O buffer on the active surface of the second chip are not an I/O terminal.

42. The method of claim 37, wherein the I/O chip pad is formed at a center portion of the substrate of the first chip, and forming the redistributed I/O chip pad layer includes:
redistributing the I/O chip pad to one of an edge region and a scribe region of the substrate, and
forming a redistributed chip pad on the edge region or scribe region of the substrate.

43. The method of claim 42, further comprising:
forming a through electrode in the substrate below the redistributed I/O chip pad of the first chip.

44. The method of claim 37, wherein the second chip is stacked on the first chip such that the active surface of the first chip faces the active surface of the second chip.

45. The method of claim 44, wherein the I/O chip pad is located at the center portion of the first chip and the I/O connection pad is spaced apart from the I/O chip pad of the first chip, and wherein stacking the second chip on the first chip includes stacking the first and second chips in an off-set so that the I/O connection pad of the second chip is aligned with the I/O connection pad of the first chip.

46. The method of claim 44, wherein the I/O connection pad is formed at the center portion of the first chip and the I/O chip pad is spaced apart from the center portion of the first chip, and wherein stacking the second chip on the first chip includes stacking the first and second chips without an off-set so that the I/O connection pad of the first and second chips are aligned at the center of the substrate.

47. The method of claim 44, wherein a plurality of the I/O chip pads are aligned in one line at the center portion of the substrate, and the I/O connection pad is formed between the I/O chip pads.

48. The method of claim 44, wherein a plurality of the I/O chip pads are aligned in two lines at the center portion of the substrate, and the I/O connection pad is formed between the two lines of the I/O chip pads.

49. A method of forming a chip stack package, comprising:
forming the chip stack of claim 37,
forming an external connection terminal electrically connected to the redistributed I/O chip pad layer of the first chip.

50. The method of claim 49, further comprising:
wire bonding the redistributed I/O chip pad layer to a wiring substrate, and
electrically connecting the wire bonding to the external connection terminal through internal wiring of the wiring substrate.

51. The method of claim 49, further comprising:
forming a test pad on the active surface of the first chip spaced apart from the I/O chip pad; and
forming a through electrode in the substrate below the test pad electrically connecting the test pad and the external connection terminal.

52. The method of claim 49, wherein stacking the second chip on the first chip includes stacking the first and second chip such that the inactive surface of the first chip faces the active surface of the second chip, further comprising:
forming a through electrode in the substrate below the I/O connection pad of the first chip.

53. The method of claim 49, further comprising:
forming a through electrode below the redistributed I/O chip pad layer in one of an edge region and a scribe region of the first chip.

54. The method of claim 53, further comprising:
forming a conductive bump electrically connecting the through electrode to a wiring substrate, and
electrically connecting the conductive bump to the external connection terminal through internal wiring of the wiring substrate.

55. The method of claim 53, further comprising:
forming a wiring layer on the inactive surface of the first chip electrically connecting the through electrode and the external connection terminal.

56. The method of claim 37, wherein each of the first and second chips includes,
a ground chip pad connected to ground wiring of the internal circuit, and
a ground connection pad connected to the ground chip pad, the method further comprising:
forming a redistributed ground chip pad layer on the active surface of the first chip, the redistributed ground chip pad layer redistributing the ground chip pad; and
forming an electrical connection part to electrically connect the ground connection pads of the first chip and the second chip.

57. The method of claim 56, wherein the redistributed ground chip pad layer is connected to the ground connection pad and ground wiring of the internal circuit.

58. The method of claim 56, wherein the ground connection pad is formed at the center portion of the substrate, and forming the redistributed ground chip pad layer includes,
redistributing the ground connection pad to one of an edge region and a scribe region of the substrate, and
forming a redistributed ground chip pad on the edge region or scribe region of the substrate.

59. The method of claim 56, wherein the I/O connection pad is formed at the center portion of the substrate, and forming the redistributed I/O chip pad layer includes,
redistributing the I/O connection pad to one of an edge region and a scribe region of the substrate, and
forming a redistributed I/O chip pad on the edge region or scribe region of the substrate.

60. A method of forming a chip stack package, comprising:
forming the chip stack of claim 56,
forming external connection terminals electrically connected to the redistributed I/O chip pad layer and the redistributed ground chip pad layer of the first chip.

61. The method of claim 60, further comprising:
wire bonding the redistributed I/O chip pad layer and the redistributed ground chip pad layer to a wiring substrate; and
electrically connecting the redistributed I/O chip pad layer and the redistributed ground chip pad layer to the external connection terminal through internal wiring of the wiring substrate.

62. The method of claim 60, further comprising:
forming test pads on the active surface of the first chip spaced apart from the I/O chip pad; and
forming through electrodes in the substrate below the test pads electrically connecting the test pads and the external connection terminals.

63. The method of claim 60, wherein stacking the second chip on the first chip includes stacking the first and second chip such that the inactive surface of the first chip faces the active surface of the second chip, further comprising:

forming through electrodes in the substrate below the I/O connection pad and the ground connection pad of the first chip electrically connecting the I/O connection pad and ground connection pad of the first chip to the I/O connection pad and ground connection pad of the second chip, respectively.

64. The method of claim 60, further comprising:

forming through electrodes below the redistributed I/O chip pad layer in one of edge regions and scribe regions of the first chip.

65. The method of claim 64, further comprising:

forming conductive bumps electrically connecting the through electrodes to a wiring substrate; and electrically connecting the conductive to the external connection terminals through internal wiring of the wiring substrate.

66. The method of claim 64, further comprising:

forming wiring layers on the inactive surface of the first chip electrically connecting the through electrodes and the external connection terminals.

\* \* \* \* \*